(12) United States Patent
Thiim

(10) Patent No.: US 8,421,475 B2
(45) Date of Patent: Apr. 16, 2013

(54) AC CURRENT SENSOR FOR MEASURING ELECTRIC AC CURRENT IN A CONDUCTOR AND AN INDICATOR SYSTEM COMPRISING SUCH A SENSOR

(75) Inventor: Søren Thiim, Horsholm (DK)

(73) Assignee: Soren Thiim ApS, Horsholm (DK)

( * ) Notice: Subject to any disclaimer, the term of this patent is extended or adjusted under 35 U.S.C. 154(b) by 203 days.

(21) Appl. No.: 12/373,244

(22) PCT Filed: Jul. 6, 2007

(86) PCT No.: PCT/EP2007/006019
§ 371 (c)(1),
(2), (4) Date: Jan. 9, 2009

(87) PCT Pub. No.: WO2008/006521
PCT Pub. Date: Jan. 17, 2008

(65) Prior Publication Data
US 2009/0315566 A1    Dec. 24, 2009

(30) Foreign Application Priority Data

Jul. 10, 2006  (EP) .................................. 06014223

(51) Int. Cl.
*G01R 31/02*   (2006.01)
*H04B 3/46*    (2006.01)
(52) U.S. Cl.
USPC ............ 324/543; 361/62; 361/76; 324/117 R; 324/117 H
(58) Field of Classification Search ................... 324/543
See application file for complete search history.

(56) References Cited

U.S. PATENT DOCUMENTS 3,422,352 A   1/1969   Paulkovich
3,422,362 A   1/1969   Paulkovich
(Continued)

FOREIGN PATENT DOCUMENTS

EP   0 463 860 A2    1/1992
GB   2205963 A       12/1988
(Continued)

OTHER PUBLICATIONS

International Search Report for PCT/EP2007/006019, the European Patent Office, mailed Oct. 9, 2007, 3 pgs.
(Continued)

*Primary Examiner* — Melissa Koval
*Assistant Examiner* — Benjamin M Baldridge
(74) *Attorney, Agent, or Firm* — Sterne, Kessler, Goldstein & Fox PLLC

(57) ABSTRACT

The invention concerns a current sensor (22; 24; 26) for substantially in real time measuring electric current in a conductor. It is suitable for application in an indicator system (1) such as a short circuit indicator system for measuring instantaneous i.e. live current value, power, reactive power, phase angle, polarity, short circuits, in single or averaged values. It comprises current responsive means comprising a current transformer (2210), adapted for mounting adjacent to said electric conductor; and sensor circuitry (2220) comprising means for emitting a non-electrical wave signal as an output; said sensor circuitry (2220) comprises current level converter circuitry (2222) comprising a current-to-frequency converter adapted to provide said non-electrical wave signal as a current level indication pulse signal ($CS_1$) having a pulse frequency ($Pf_{cs}$) which is proportional to said real time electric conductor current, when the latter is within a predetermined current interval ($I_1$-$I_2$). Thus, a low cost sensor is provided. The invention further relates to an indicator system (1) for an electric conductor comprising at least one of the above mentioned current sensors (22; 24; 26).

16 Claims, 6 Drawing Sheets

U.S. PATENT DOCUMENTS

| | | | | |
|---|---|---|---|---|
| 3,825,768 A * | 7/1974 | Grygera | | 307/127 |
| 4,749,941 A * | 6/1988 | Halder et al. | | 324/142 |
| 4,804,910 A | 2/1989 | Russell | | |
| 5,157,708 A * | 10/1992 | Garthwaite et al. | | 379/21 |
| 5,352,958 A * | 10/1994 | Cunningham et al. | | 315/291 |
| 5,488,307 A * | 1/1996 | Plott | | 324/555 |
| 5,748,095 A * | 5/1998 | Horstmann | | 340/664 |
| 5,943,203 A * | 8/1999 | Wang | | 361/75 |
| 6,236,949 B1 * | 5/2001 | Hart | | 702/64 |
| 6,424,136 B1 * | 7/2002 | Gardner | | 324/76.11 |
| 6,566,855 B1 * | 5/2003 | Nguyen et al. | | 324/117 R |
| 6,756,907 B2 * | 6/2004 | Hollaway | | 340/635 |
| 7,068,025 B2 * | 6/2006 | Bjorn | | 324/96 |
| 7,640,059 B2 * | 12/2009 | Forsberg et al. | | 607/27 |
| 2003/0107860 A1 * | 6/2003 | Dougherty | | 361/62 |
| 2004/0229578 A1 * | 11/2004 | Lightbody et al. | | 455/127.1 |
| 2005/0057941 A1 * | 3/2005 | Pederson et al. | | 362/542 |
| 2006/0267514 A1 * | 11/2006 | Xu | | 315/291 |
| 2007/0013322 A1 * | 1/2007 | Tripathi et al. | | 315/291 |

FOREIGN PATENT DOCUMENTS

| | | |
|---|---|---|
| GB | 2 339 295 A | 1/2000 |
| JP | 63-122965 A | 5/1988 |
| JP | 05-004047 U | 1/1993 |
| JP | 11-230994 A | 8/1999 |
| RU | 2222021 C1 | 1/2004 |
| SU | 1419319 A1 | 12/1995 |
| WO | WO 2004/099798 A2 | 11/2004 |

OTHER PUBLICATIONS

International Preliminary Report on Patentability for PCT/EP2007/006019, the European Patent Office, mailed Oct. 13, 2008, 8 pgs.
Extended European Search Report and Written Opinion for European Application No. 06014223.9 mailed Feb. 5, 2007, 6 pgs.

* cited by examiner

AC CURRENT SENSOR FOR MEASURING ELECTRIC AC CURRENT IN A CONDUCTOR AND AN INDICATOR SYSTEM COMPRISING SUCH A SENSOR

TECHNICAL FIELD OF THE INVENTION

The present invention relates to a current sensor for performing a substantially real time measurement of electric AC current magnitude in a conductor, comprising current responsive means comprising a current transformer adapted for mounting adjacent to said current conductor; and sensor circuitry comprising means for emitting a non-electrical wave signal as an output. The present invention further relates to an indicator system comprising such a sensor, suitable for processing said non-electrical wave signal for different monitoring purposes, such as indicating short circuits.

BACKGROUND OF THE INVENTION

Current sensors are available, which are being used for a wide range of applications, such as being part of indicator systems indicating different electrical states in a conductor based thereupon, such as momentary and average current values, power values, the presence of short circuits, faults on the line, circuit breaker cut outs and the like. In order to provide reliable current sensing an accurate, real-time status feedback is needed. Current sensors are available for DC and AC electrical systems. In the context of the present application, only current sensors for conductors leading AC current are considered and discussed.

One example of an electrical state to be indicated is short circuits. The indicator system being discussed below relates to indicating short circuits. However, it has by the invention been realized that a wide range of current states or current based conditions may be monitored by a current sensor according to the invention, and an indicator system according to the invention comprising such current sensor may be used to indicate a multitude of electrical states based thereupon. The indicator system adapted for short circuit detection should thus not be construed as limiting the invention, but rather exemplifying it.

When short circuits occur during operation of electrical AC power lines, such as for example high and medium AC voltage distribution and supply power lines in a distribution network or power lines for rail roads, it is important to locate and repair these as quickly as possible. To that end, short circuit indicators are available on the market.

Generally, known types of short circuit indicators comprising a current sensor for electrical AC power distribution lines are available for remote or local indication of the presence of short circuits thereon in order to reduce localization time for maintenance work and the associated costs therewith. In particular when measuring high voltage AC power lines, the problem is to determine the occurrence of such short circuit, e.g. by measuring the current or more correctly the short circuit current, without a potential connection to the electric AC power line, which would be too costly due to the requirement of having a high degree of insulation between conductor and ground, e.g. a remotely positioned indicator unit.

The short circuit currents experienced in an electric conductor in AC power lines are often several orders higher than the normal state current, depending on conductor impedance and distance between the sensor and the position of the short circuit on the conductor. The value of the measured currents at which the indicators are set to indicate a short circuit, i.e. the short circuit current threshold, may be adjustable because the set threshold is dependent upon conditions at the application point, e.g. different cable cross sections and changing electrical load.

Some available types of short circuit indicators for AC conductors comprise one sensor for each phase or conductor being monitored, and comprise two different types:

A first sensor type provides the indicator of a short circuit adjacent to the sensor i.e. integrated with the sensor being mounted upon the monitored conductor in a sensor-indicator unit. That is an advantage when monitoring e.g. overhead power lines, which are freely visible from the ground, and the indicator is e.g. mechanical or a powerful light flashing or alternatively an RF signal being emitted at the moment of a short circuit being sensed. An example of such sensor-indicator units are described in e.g. U.S. Pat. No. 5,748,095 for local overhead display of a short circuit state by a flashing light or a red dot on the line being monitored, while during normal state currents, no light or a green dot is provided.

The second type provides the indication unit remotely from each sensor unit, e.g. one for each of the three phases being monitored, in a short circuit indicator system. That is an advantage when monitoring e.g. ground cables, which are not freely visible, and thus the indicator unit is placed in a position, which allows for easy maintenance thereof. An example of such short circuit indicator system is described in EP 0 463 860. Here also, the indication is provided when a fault or short circuit has been sensed by the sensor unit.

A conventional current sensor for the two indicator type comprise a current transformer, which may be an open or clamp-on type transformer consisting of an attachable magnetic material yoke for arranging around one conductor or power line forming the first winding, i.e. a single transformer turn in the transformer. The secondary transformer winding is wound around the magnetic material, e.g. with several windings for supplying the current sensor unit with a measurement current. This type of current transformer allows installation on power system cables without disconnecting the power system cables from their source or load.

Generally, the first type of available indicators comprising a current sensor is suitable for AC electrical power lines of all voltages, and the second type of available indicator is suitable for AC voltage due to the isolation required between sensor and the ground level provided at the indicator unit.

However, many of the short circuits experienced by the power distribution companies are provided in high, medium and low Amp, medium voltage (MV) systems, i.e. from 1 to 40 kV and low voltage (LV), i.e. 110 to 480 V AC power lines. Even if the frequency of experienced short circuits is low, some power distribution companies have imposed fines when power outages occur on their distribution network, which fact presents an incentive for these companies to increase up-time in all areas of the power grid. The indication of short circuits is also needed in related MV and LV fields, e.g. rail road operational power lines transmitting AC voltage around 1 kV, and distribution power lines around 400 V.

Accordingly, automated, remotely monitored indicators are needed, which are suitable both for HV, MV and LV power AC distribution cables and for a wide range of conductor current levels.

As an example, in an electric power distribution network, there is in particular in the medium voltage (MV) and low voltage (LV) grid a multitude of distribution nodes or stations, which delivers connections to different consumer groups. The majority of current carrying lines are at present provided as underground cables; only a few locations present air cables, especially in rural areas. By the presence of faults or specific current states such as short circuits in the grid it is important to locate and correct the errors quickly and reliably, and important to be able to differentiate between temporary current surges and other lasting specific current states, such as short circuits.

An advantage of remote monitoring of e.g. short circuits in the many MV and LV AC power lines is that identification of problematic power lines may be performed easily and quickly for a determination of the position and extent of investments in improved grid infrastructure, maintenance of older and/or failing equipment and replacement thereof. This considerably decreases maintenance and planning costs for the electric power distribution companies.

The above mentioned EP 0 463 860 disclose a faulted circuit indicator having a detector which indicates fault currents in a monitored conductor to the remotely located indicator using an electrically isolated signal link there between. The detector comprises a current sensor which is connected to a load carrying conductor, and the detector is detecting the presence of a fault or system disturbance in the monitored conductor and is signalling the indicator unit of such an event. When a fault of a predetermined current magnitude is detected by said detector, a light pulse is transmitted from the detector to the indicator via the link i.e. a fibre optic cable, where upon receipt the pulse is converted to an electrical pulse causing the indicator to indicate a "fault" state. The use of an electrically isolated fibre optic cable ensures galvanic separation between the power line and the indicator, and also reduces problems with electric interferences upon the relayed detection signal.

However, said known detector may not be sufficiently fast to both sense, detect and convey all instances of short circuits during the available detection time period before the line current has reached zero. Having a short circuit happening close to the indicator reduces the duration of the short circuit current experienced and increases the maximum current value thereof, because these two factors are dependent both upon the distance from the indicator position to the short circuit on the conductor and upon the normal state current in the power lines. Further, said detector may not be sufficiently precise to distinguish between rush-in current peaks and real short circuits resulting in blown fuses.

Thus, the prevalent technical prejudice has been that self-sufficient current sensors in the above mentioned two types of known indicator systems for HV power lines have been too slow to indicate nearby short circuits, in particular if attempted applied to LV and MV power lines. As an example, in a 1 kV rail road power line, the disconnection time period for the short circuit release is reduced to 5 ms when experiencing a nearby short circuit. Accordingly, the detection time period for providing a reliable current sensor sensing of a short circuit is around or shorter than 5 ms. This time period is equal to one fourth of a period in a 50 Hz system, which period is the shortest known measurement interval needed for prior art AC short circuit indicators.

WO 2004/099798 discloses a current measurement device, a system comprising such device and a compensation method for calibrating such system, wherein the device comprises a fibre optic Faraday effect current sensor for an electric current measurement in MV power lines. The sensor comprises a magneto-optical material being placed transversally to the current in a power line and measures the Faraday effect of the current therein, which states that the plane of a polarized incident light undergoes a rotation relative to the magnetic field applied. The sensors are connected to measuring modules using optical fibres, which guide the polarized light. As stated in the document a disadvantage of these Faraday effect sensors is that there are sources for disturbances of the detection of the polarization change of the light signal, comprising optical noise in the detection circuit, electrical noise in light source, interference from magnetic fields from nearby inductors and systems, sensor mounting and setup, conductor shape and diameter, sensor production tolerances, temperature effects on light source and detector, light source and detector degradation over the products lifetime. Thus, calibration both prior to commencing measurements and during monitoring the lines is necessary, which increases the costs of the sensor and indicator units alike. Given the fact that a large number of devices is required for enabling a network monitoring system, this increases the total cost of the disclosed system.

In U.S. Pat. No. 6,566,855 is described a device or sensor measuring current magnitude in a conductor coupled to an electrical device. Said device generates an electrical output signal comprising a series of pulses having a frequency, where said frequency of the series of pulses is responsive to the magnitude of current measured. The device is applied to sensing current for different types of electrical loads, such as pumps, compressors, heaters, conveyors and the like for LV and AC current conductors. However, said device is not suitable for monitoring HV or even MV conductors, because the device needs to be sufficiently electrically insulated between conductor and ground. This is due to the fact that the device utilises a low voltage optical isolator, and the device may only at a high cost be adapted to higher voltage applications. Further, the frequency signal is transmitted from the device to the digital controller via electrical cables. Accordingly, an application to HV and MV AC conductors would require the application of an expensive electrical isolation between device and conductor, or indicator and ground. Further, the sensor disclosed is too slow to provide time-realistic current values as it provides an average current value measured over a relatively long sampling time period, i.e. more than one cycle period, as may be seen from the circuit diagram provided.

Accordingly, it is an object of the present invention to provide a low cost AC current sensor suitable for integration in an indicator system, e.g. for indicating short circuits, and corresponding indication system, which provides for rapid detection of current states in electric AC conductors, in particular being easily adaptable for use in detecting a wide range of conductor current magnitudes in both LV, MV and HV power distribution, e.g. for detecting short circuits. Further, an object of the present invention is that the current sensor, and thus also the indicator system must be able to provide reliable indications of such current states, such as short circuits within short detection time periods, e.g. shorter than 5 ms.

SUMMARY OF THE INVENTION

This object is achieved by the initially mentioned current sensor and an indicator system comprising such a sensor.

Accordingly, in a first aspect of the invention, there is provided an AC current sensor for performing a substantially real time measurement of electric AC current magnitude in a conductor and for generating a non-electrical wave signal as an output, said non-electrical wave signal comprising a series of pulses having a frequency, which is proportional to the magnitude of current measured, said current sensor comprising current responsive means comprising an inductive wire-wound current transformer, adapted for mounting adjacent to said electric conductor, said current responsive means providing electrical power as a driving current for said current sensor; sensor circuitry comprising current level indication circuitry comprising a current-to-frequency converter adapted to provide said non-electrical wave signal as a substantially real time current level indication pulse signal having a pulse frequency which is proportional to the magnitude of said conductor current when it is within a predetermined current interval ($I_1$-$I_2$); and said sensor circuitry further comprising means for emitting said non-electrical wave signal as an output.

The non-electrical wave signal is preferably a light signal from a LED, and the provision of a pulsed signal during normal state currents providing substantially real time current measurements rather than a single error signal during other current states, such as a short circuit, enables a wide range of applications for said sensor.

Also, a low cost sensor is provided. The components providing current-to-frequency converters are known in themselves in the art, and easy to implement, and often comprise an oscillating circuit, e.g. comprising one or more amplifiers. By the invention a limited number of power consuming components are utilized for the current level indication circuitry, which reduces the total power consumption of the sensor, which again is provided from the conductor to be measured.

This is a major advantage, because then a very small lower set point $I_1$ may be selected, and accordingly the sensor is able to measure very small current magnitudes of normal state conductor currents. Preferably, $I_1$ may be selected based upon minimum driving current required for providing said non-electrical wave signal i.e. the current value providing the minimum driving current of the sensor circuitry, and may be provided by a balance between current transformer output and circuit layout, depending on required application.

Further, the production costs of each individual current sensor as compared to prior art sensors, detectors and indicators are low. This is in particular an advantage when utilizing many current sensors, e.g. in a distribution line network monitoring, thus reducing installation costs.

Further, installation costs have been reduced as compared to e.g. the Faraday sensors, because initial or subsequent adjustments are not needed relative to a detection unit, because the sensor components are less sensitive to environmental influences such as ambient temperature, electrical and magnetic fields and humidity.

Also the maintenance costs have been reduced because maintenance personnel may simply replace a damaged or malfunctioning current sensor, and the sensor unit may preferably being provided in one piece, requiring no repair and easing replacement. This is an advantage for MV and LV power lines, as these nets require a large number of sensor units in the nodes for a covering monitoring net.

The person skilled in the art may accordingly provide a frequency interval corresponding to any suitable predetermined current interval, i.e. said sensor provides substantially freely selectable performance ranges, by selecting the appropriate components providing the current-to-frequency converter, i.e. the current sensors may be suitable for measuring different current intervals, in multi-range sensors ranging from wide-range to short-range ones, and very adaptive selection of the two end points thereof. This provides for different current sensors according to the present invention, e.g. one sensor may be provided for measuring currents within a predetermined medium-range current interval 10 to 160 A, another sensor may be provided for a predetermined wide-range current interval of between 2 to 500 A, and another for small conductor current levels, say a short-range sensor for conductor currents between 2 and 20 A.

For example, said predetermined current interval may be between 40 and 160 A, or between 20 and 200 A, or between 10 and 40 A, where each current interval may be selected appropriately by suitably selecting the components of the current transformer, such as winding number, winding material quality, individual winding diameter, and quality of transformer iron, and based thereupon selecting a set of components for the sensor circuitry, each sensor thus being adaptable to the current within the conductor line to be measured. Thus, the resulting current interval is also a function of the responsiveness of the current responsive means, e.g. current transformers made of high, medium or low grade iron. Tests performed by the applicant have shown that when using a current transformer using generally available low grade iron, a current interval measured of a MV line was achievable of between 10 and 160 A with the same current sensor. When using high grade iron, tests have shown that a current interval of each sensor between 2 to 500 A is achievable.

By providing the sensor with a self-powering ability, i.e. power for the function and measurements being performed within said sensor is supplied substantially from the line to be measured upon, this removes the requirement of having an external power supply for the sensor. This is in particular is an advantage for high voltage power lines due to the extensive electric insulation required in order to remove any risk of earth faults through the sensor unit to the remotely positioned detection unit.

It has by the invention been realized that even when having normal state conductor currents below the predetermined current interval, short circuit currents can still be detected, because the values of the short circuit currents, which are occurring and which are to be sensed, may be several times higher than the values of the line currents during normal states. Accordingly, a current sensor according to the invention is also suitable for sensing short circuit currents much higher than normal state currents, as long as the short circuit currents lies within said predetermined current interval $I_1$-$I_2$ or higher at least for the duration of a measurement interval of e.g. 5 ms. Accordingly, normal state line currents down to zero may be monitored, even though the current levels does not reach levels, where the sensor is providing any frequency signal. Thus, a sensor presence or availability signal is advantageous in order to ascertain, that the sensor is live and measuring, even if no current pulse signal is emitted from it.

Tests have shown, that normal line currents of as low as approximately zero may be measured upon for a reliable indication of a short circuit current by sensor units according to the invention.

By the invention, it has been realized, that the known current sensors of the first type have been provided with very slow sensor circuits, so that when a lower current than normal driving current is applied, i.e. when a short circuit state has passed and gone, there is no driving current in the sensor at exactly that point in time when that power is needed. They have thus been enabled for providing an error signal, when the short circuit state has reached Sensors of the second type are very slow, because they have measurement periods lasting longer than one period or more.

However, it has by the invention been realized that by a combination of the advantages from the two types of known sensors, i.e. the self-sufficient current transformer providing the sensor driving current from the first type of indicator, excluding the fault sensing and using the wave emitting capability and thus electrically isolated feature of the second indicator type, and by providing a relatively high frequency current-to-frequency converter, a third type of sensor unit has been provided, which provides a low cost, stable sensor providing low power consumption and being adaptable for a wide conductor current and voltage range.

According to an embodiment of a current sensor according to the present invention the pulse frequency of said current level indication pulse signal lies within a predetermined frequency interval, e.g. between 1 to 250 kHz or other suitable interval, where said frequency interval is selected to be suitable for cooperation with an indicator system, i.e. for a reliable indication of the actual, substantially instantaneous current value and related current states.

The pulse frequency performance interval may be adapted for the current sensor cooperating within an indicator system such that the selected pulse frequency interval may be broad-, medium- or narrow-range, and the two end points, i.e. the minimum and maximum value selected according to the requirements of the available detection unit within said indicator system and of course to the width and positions of the current value intervals, they are to correspond to.

Further, these frequency ranges are selected as correspond to the expected currents to be measured, depending on application of the sensor, to accommodate a certain number of pulses during the measurement time period, e.g. until the current is zero in the monitored conductor after a short circuit. The number of pulses may in all cases be as low as one pulse per measurement period or more, see further below.

Examples of operational pulse frequency ranges could be between 50 and 180 kHz, between 10 and 90 kHz, between 100 and 130 kHz, between 10 and 300 kHz, or extend into the MHz or Hz ranges, or any other suitable range. Generally, a substantially positive correspondence is selected, where a low pulse frequency reflects a lower instant conductor current value, and a high pulse frequency reflects a higher instant conductor current value, respectively. However, any other relationship known to the skilled person may exist, according to application and system requirements, such as a negative linear relationship, an exponential relationship, or any other relationship known to the skilled person.

In a further, preferred embodiment of a current sensor according to the invention said sensor circuitry further comprises sensor availability indication circuitry adapted to provide said non-electrical wave signal as a sensor availability indication signal indicating the availability of the sensor, in particular when the electric conductor current is below said predetermined current interval. As mentioned above, when the normal line current is below the predetermined current interval, i.e. this is too low to be measured continuously by the current sensor, the latter will not provide a current level indication signal during those time periods. By providing the present embodiment, the current sensor will be transmitting a sensor availability indication signal to indicate that the current sensor is working properly, e.g. to maintenance or monitoring personnel and/or to automated machinery, such as a remotely positioned monitoring PC. Accordingly, the effective current sensing performance range has in fact by the invention been increased to current values far below the lower end point of the predetermined current interval $I_1$.

It has been realized by the above mentioned preferred embodiment of the present invention, that this is a specific advantage when a very low current is present as a normal state line currents. When used with relatively low normal state conductor currents, e.g. 0.5 A and up to the low end of the measuring range $I_1$, the induced driving current in the sensor unit may be too low to drive the current-to-frequency converter and provide a pulse signal for indication of conductor current. It has by the invention been realized, that such indication of conductor current is not needed during the normal state, i.e. the energized state of the conductor, but only during the occurrence of a short circuit current in said conductor.

The sensor availability indication signal, e.g. providing a recurring signal during low power states, may appear differently from the current level indication pulse signal in order to for an indicator system to be able to differentiate between the two signals when these are being relayed thereto. The pulse signals and recurring signal may for example be different in pulse length, pulse frequency, transmitter frequency such as a significant difference in light frequency interval used. However, this may be adapted in any way suitable, e.g. in conventional ways known to the person skilled in the art of signal processing.

In yet another embodiment of said current sensor according to the present invention, the pulse frequency of said recurring sensor availability indication signal is predetermined and relatively low compared to the frequency of said current level indication pulse signal, such as the interval between once per one tenth of a second and once per ten seconds, preferably around once per second. Given the fact that the sensor, when measuring very low currents, is provided with very low power to drive the sensor circuitry, i.e. a very low current, it is an advantage to provide such sensor availability signal only when needed in order to reduce the power needed for driving the sensor availability indication circuitry. Thus, the pulse recurring frequency of the latter signal is preferably kept low. This provides for another advantage, as the sensor below its current range may be put in a low-power state where the current-to-frequency converter is disabled, reducing the total power consumption of the sensor, e.g. by increasing $I_1$. By directing all available power to the sensor availability circuitry it is possible to let the sensor availability function to be active down to a very low conductor current e.g. below 1 A or even approaching zero for a current measuring range up to more than 500 A.

In a further preferred embodiment of said current sensor according to the present invention, said sensor circuitry further comprises voltage lost indication circuitry for providing an electrostatic voltage measurement of said electric conductor and adapted to provide said non-electrical wave signal as a voltage lost indication signal, the presence of which is indicating that the voltage over said electric conductor is lower than a predetermined minimum voltage value after a predetermined time period after the current is below said predetermined current interval, which predetermined time period is preferably shorter then the period of the sensor availability indication signal, such as after from 50 to 500 ms. Thus, the need for separate voltage sensor, e.g. in the form of a separate transformer for voltage monitoring of the conductor is eliminated, which reduces the number of system components required and to be installed, which substantially reduces the total installation and maintenance cost of said system. The predetermined minimum voltage value may preferably be 30 to 50% of nominal voltage or any other suitable low voltage level. Preferably, said sensor availability indication circuitry and said voltage lost circuitry is provided integrally for providing at least said voltage lost indication signal in the form of one specific pulse. The power normally supplying the availability circuitry may then be used for powering the voltage lost indication circuitry. Further, the determination of the voltage being low is performed locally within the current sensor, which reduces the complexity needed in further circuitry within said indicator system. Said specific pulse may be a pulse different from the other pulses, as mentioned above, e.g. having a specific amplitude or using a specific transmitter wave frequency band, or being a singular pulse after a predetermined period of no pulses.

In a further embodiment of the current sensor according to the present invention, said sensor circuitry further comprises power flow direction indication circuitry for providing a phase angle indication signal and a polarity indication signal from said means for emitting a non-electrical wave signal. Accordingly, using phase and polarity of the current to provide the power direction of the conductor current said sensor is able to provide an indication as to in which direction relative to the current sensor the current state, e.g. short circuit in question has occurred, because the direction indication provided herewith in the measurement time period provided just before the short circuit is registered by the indicator system, and thus the polarity, phase and possibly also direction to the short circuit or the like may be calculated from that information. Again, the measurement needed for performing the power flow direction determination is performed in the sensor, and the determination and display of said direction is performed within the short circuit indication system.

Alternatively, in a further embodiment of the current sensor according to the present invention, said sensor circuitry further comprises power flow direction indication circuitry for providing a specific flow direction signal indicative of said power flow direction from said means for emitting a non-electrical wave signal. Thus, the signal indicating flow direction may be used directly by said indicator system for providing and displaying power flow direction. The binary signal may be provided from a micro controller unit or other circuitry located within the sensor circuitry.

In a preferred embodiment of said current sensor, said means for emitting a non-electrical wave signal is at least one light emitting diode and the non-electrical wave signal is at least one light signal. Thus, in particular for HV and MV power lines any electric influences on the wave signal from the conductor current due to radio frequency or electro-magnetic interferences are removed.

In one embodiment thereof there is provided means for emitting a non-electrical wave signal for emitting each of said pulse and other indication signals, and in another there is provided one means for emitting a non-electrical wave signal for emitting all of said signals. Having one emitter for each signal reduces the error frequency, if the same emitter is to emit superimposed signals, however, one or a reduced number of emitters is an advantage, since only one or a reduced number of receivers and communication links are needed, which reduces the production and installation costs. Of course, only one receiver/communication link may be necessary, if appropriate signal processing is used during transfer and receiving of said signals. One way of using signal processing is by one embodiment wherein the wave frequency band of each of said pulse or other signals differs from the others, or more than one LED having each their different spectrum and/or amplitude.

In yet a further, preferred embodiment of the current sensor according to the present invention, said means for emitting a non-electrical wave signal is at least one light emitting diode and the non-electrical wave signal is at least one light signal. Accordingly, by using a Light Emitting Diode or LED for providing the pulse signal or signals from the current sensor, a reliable signal may be provided, for which the detection thereof in an indicator system may be provided using commercially available components, such as pulse counters e.g. comprising photodiodes, alternatively light sensitive circuitry integrated with a micro controller unit (MCU). This reduces production costs and increases reliability of the received signal. The LED may be transmitting in different light frequency intervals, according to the signal being transmitted, which frequencies may be selected from the available types, comprising infrared, visible, ultra violet and laser diodes. Other non-electrical wave signals are conceivable, including sound and mechanical wave signals. These may however prove to be too slow for the present application for providing a rapid indication of current states. Another type of wave signal is RF-waves, or other electromagnetic wave signal.

In another embodiment of the current sensor according to the present invention, said means for emitting a non-electrical wave signal is one device providing all signals, alternatively it is one device for each signal. By using only one device, e.g. one LED for providing one or more signals, e.g. for indicating different measurement results of the current sensor, the number of output devices such as a communication link is kept low, which reduces the production and installation cost. However, providing more than one device may prove to increase the reliability of the signal transmitted, since they may be superimposed and cooperating for detection by one or more detection means. Accordingly, different signal processing techniques may be used in order for said indicator system to be able to differentiate between the different signals provided by a current sensor. Thus, in one embodiment the wave frequency band and/or pulse length of each of said pulse signals differs from the others. In another embodiment, the amplitude of each of said pulse signals differs from the others.

In order to provide a reliable pulse signal with a high resolution, which signal may be registered by presently available electronic components, in one embodiment of the current sensor according to the invention the pulse width of each pulse, at least of the current level indication pulse signal, is from 0.5 to 5 µs, preferably from 1 to 3 µs, most preferably from 1.2 to 2 µs, thus also providing near real time measurements. This may be accomplished by selecting the appropriate composition of the current level indication circuitry, e.g. using a fast current-to-frequency conversion. Further, signal processing provides another embodiment of the present invention wherein the pulse width and/or height of each pulse signal differs from the others suing signal processing techniques.

In one embodiment of the current sensor according to the present invention, it is adapted to supply further electric power to said sensor. Alternatively or as a supplement, said sensor comprises a local electrical power supply, i.e. an internal supply such as a battery and/or a external supply, such as solar powered panels and/or one or more RF-powered power receivers. Generally, the current transformer is used to provide for a self-sufficient current sensor, i.e. the power for driving the current sensor is drawn electromagnetically from the conductor current using the current transformer. This is an advantage when monitoring AC HV or MV power lines, wherein the power is provided therefrom. At least one of the conductors to be measured upon is passed through a magnetically permeable core that magnifies the magnetic field of the conductor or conductors. AC current constantly changes potential from positive to negative and back again, generally at the rate of 50 or 60 Hz. The expanding and collapsing magnetic field induces current in the windings, allowing one to accurately measure the electrical current in the cable. However, the current sensor may further comprise a local electrical power supply, i.e. an internal supply such as a battery and/or an external, yet from the surroundings electrically isolated supply, such as solar powered panels and/or RF-powered power receiver. A battery or other backup such as solar panels, which may be electrically isolated from the surroundings may be an advantage The voltage lost indication is only necessary after a short circuit has occurred on the measured conductor, and then due to the high short circuit current ample energy is at hand to drive the sensor.

The provision of supplemental local power does not increase maintenance work, e.g. for replacing batteries, or the like, because the life time of the batteries used may advantageously far outlast the power required by the sensor, since in particular the voltage lost indication circuitry requires a very minimal power source. Preferably, said supplemental backup is rechargeable batteries and/or capacitors, being e.g. recharged during normal state currents by said conductor current.

In an embodiment of the current sensor according to the present invention, it is adapted for an electric conductor being an AC power line in a power distribution network. Alternatively, it is adapted for an electric conductor being an AC power line for a rail road. These are areas of use of the current sensor and corresponding indicator system, in which they are particularly advantageous, because they are low cost and many current sensors may be required for a covering monitoring network, especially in LV and MV power distribution networks, and for rail road power lines. It has by the invention been realized that the electric conductor to be sensed could as well be a consumer electric cable, e.g. for a home appliance.

In an embodiment of the current sensor according to the present invention, it is further being adapted for sensing more than one conductor, e.g. for sensing earth leakages to electric loads by performing difference analysis. In an embodiment of the current sensor according to the present invention, the size of the yoke of said inductive wire-wound current transformer is adapted for surrounding, holding and sensing more than one conductor. The transformer in the sensor may then be provided with a yoke of relatively large dimensions for surrounding more than one conductor or in other ways be adapted for sensing more than one cable. When a difference analysis is required, e.g. when performing earth leaks to different electric loads, such as pumps, heaters, and the like. This is in particular also an advantage for multi-cabled conductors, e.g. when the conductor is provided with a grounded cable section.

In an embodiment of the current sensor according to the present invention, said sensor, i.e. said current responsive means, circuitry, and emitter means are all provided in a unitary unit comprising a housing. Thus, a low cost, low power consuming current sensor device is provided, which may be miniaturized, designed and easily installed on conventional power lines or conductors of a multitude of types.

In a further aspect of the present invention there is provided an indicator system for an electric conductor, comprising an AC current sensor of the above mentioned kind. In one embodiment thereof said indicator system further comprises an electrically isolated communication link for relaying at least said non-electrical wave signal from said current sensor; and a detection unit operable for sensing at least the frequency of at least said current level indication pulse signal from said current sensor and translating it to an instantaneous current value for application to determining different conductor states, such as instantaneous current value, the occurrence of short circuits, relay cut outs, power surges, and the like.

Thus, a versatile, rapid and reliable indicator system is provided, which may be adapted for use with electric conductors in LV, MV and HV power lines and for a wide current detection range, and may be used for indicating a number of current based states, such as average current value, short circuits, power line faults, relay cut outs, base line faults, and all substantially in real time, providing instantaneous current values.

The determination of a current state present upon the conductor, e.g. whether a short circuit has occurred, is preferably provided remotely from the sensor unit and not within the self-powered sensor unit, as is the case with some types of known indicators. In the known indicators, the current sensing, the determination of a short circuit, and often also the indication thereof are all provided within a device provided at the conductor. By the invention, the applicant has realized that if one were to provide determination of a current state, such as a short circuit state, remotely from the sensing, the determination itself and the indication thereof may be supplied with a continuous power supply e.g. from a separate indicator unit, which makes the determination and indication independent from detection time period limitations. This provides the advantage that short circuit determinations may be performed within very short current sensing time periods. This provides for a very rapid and reliable determination of the AC current magnitude value.

The detection unit is preferably adapted for selecting one or more of the presently available current states to be monitored by providing selection means such as dip switches, buttons, display means or buses for setting one or more of said current states to be measured.

A current sensor according to the invention comprises current-to-frequency converters for providing different or modulated pulse signals, which frequency and/or presence is indicating sensor results from the current sensor or sensors, instead of known indicator systems according to the first type, which provide detectors located upon the conductor lines for providing a determination of a current state, such as a short circuit, at the moment of occurrence. This significantly reduces the number of power consuming components of the sensor circuitry, which fact, as mentioned above, significantly reduces the lowest detectable conductor current $I_1$. Further, by using modulated and/or different pulse signals or signals for each different measurement, one or more of signal processing techniques known to the skilled person may be used to differentiate between the different signals and their information content.

The term "non-electrical wave signal" is defined as a signal in a wave motion of a media, which is not electrical, i.e. not propagating using electrons, but in any other form, such as in particular using an electromagnetic wave, such as visible or infrared light, radio frequency waves, or other non-electrical wave, such as mechanical or sound wave. Using an electrically isolated communication link, e.g. such as an optical cable, for the non-electrical wave signal has the advantage of providing an electrically isolated transfer line between indicator unit, which often is grounded, and the conductor to be measured upon. However, another advantage is that when providing one or more of such links, when provided by wiring in connection with other cables, such as electrical cables in e.g. electrical panels, junction and fuse boxes, switches and the like, the risk of e.g. an isolation defect causing an electrical arc between the cables is decreased significantly.

In another embodiment thereof, the indicator system further comprises current threshold means operable for determining whether the current corresponding to the frequency of said current pulse signal is above a predetermined current threshold; and short circuit display means operable for indicating that a short circuit has occurred on said electric conductor based on said current determination, thus providing a short circuit indicator system.

The time realistic, precise current value provided by the at least one sensor may accordingly be used for determining whether a short circuit is present on the electric conductor being monitored, even for LV power conductors and/or for nearby short circuits in HV lines.

In use, tests have shown that a indicator system according to the invention is very rapid, and is providing reliable current measurements and short circuit detections within durations of short circuit currents of less than 1 ms, which is very short compared to presently available known current state indicators and detectors.

In a preferred embodiment of the indicator system according to the present invention, it further comprises voltage measurement means for performing a voltage measurement over said electric conductor; voltage threshold means operable for determining whether the voltage measured by said voltage measurement means is below a predetermined voltage threshold after a predetermined time period after said current threshold means has made a positive determination; and said short circuit display means being operable for indicating that a short circuit has occurred on said electric conductor when said voltage threshold means has made a positive determination. Accordingly, the present indicator system is not sensitive to short termed current peaks not related to short circuits, which reduces the number of error indications.

In an embodiment thereof, said voltage measurement means and said voltage threshold means are provided integrally within said current sensor comprising said voltage lost circuitry. Accordingly, a separate voltage measurement sensor may be dispensed with, which further reduces installation and maintenance costs. Alternatively, said voltage measurement means comprises a voltage measurement sensor separate from said current sensor, in which case the voltage threshold means are provided separately from said current sensor, preferably within a detection unit. Performing a voltage measurement after a given time period ensures that temporary current peaks within the conductor, which peaks are not due to short circuits, may not erroneously be determined as being short circuit currents.

In a preferred embodiment of the indicator system it further comprises sensor availability display means, which is operable in particular when said conductor current is below said predetermined current interval. Accordingly, the working range of the indicator system has been increased to including current levels below said predetermined current interval.

In an embodiment of the indicator system according to the present invention, it further comprises current level display means. For example an LCD display or LED value indicators, or the like. Thus, the present level of current is displayed, e.g. one display for each conductor, or one display for all, providing e.g. an average or an RMS-value (Real Mean Square) of the conductors being monitored. The current level shown is generally the normal state line current within the predetermined current interval and not the short circuit current measured. The display may further be used for setup purposes, indicating setup variables and values.

In an embodiment of the indicator system according to the present invention, said detection unit is remotely located from said current sensor. This increases the accessibility of the detection unit, e.g. for maintenance and repair, which is an advantage in particular for ground and air cables, which are difficult to access, reduces the influences from electromagnetic disturbances on the determination of a short circuit of said system, and provides the possibility of providing one detection unit for more than one current sensor. Alternatively, the detection unit is provided integrally with said current sensor, which may be an advantage for a single conductor being monitored for low power cables, such as domestic cables.

In a further embodiment of the indicator system according to the present invention, said current threshold means further comprises an adjustable input current setting device, such as one or more DIP-switches, potentiometers and/or push buttons, or by using the display means for setting the input current for providing said current threshold value. Accordingly, the same current sensor may be applied to different types of conductors by adjusting the current threshold to a suitable value, which is depending on the short circuit currents expected at that point on the monitored conductor. The adjustable input current setting device may provide the input current, i.e. the normal state conductor current for which the system is sensitive. This may be available in steps or continual setting, e.g. an adjustable input current in 14 steps from 40 A to 160 A. Thus, the installation has been eased. In one embodiment thereof, said adjustable current threshold setting device is provided with means for a remote setting of the adjustable current threshold. Accordingly, the current interval said system may be remotely operated, which reduces the man hours needed for transportation to a indicator system, in case the input current changes or the like.

In yet a further embodiment of the indicator system according to the present invention, said communication link is an electrically isolated fibre optic cable and the non-electrical wave signal is a light wave signal, which reduces electromagnetic influences on the signal transmitted therein.

In another embodiment of the indicator system according to the present invention said short circuit display means comprises at least one light emitting diode. Thus, individual indication of a short circuit in one or more of the conductors is provided.

In an embodiment of the indicator system according to the present invention, said short circuit display means is further provided remotely from said detection unit for a remote indication of a short circuit, e.g. such as a digital interface module for communication with a remote PC for the display of a short circuit and other parameters. A PC with suitable software and a digital interface unit in communication with e.g. a digital interface of said detector unit will provide the possibility of a common display of short circuits or other current states from more than one indicator system: This reduces the time needed to inspect each detection unit of the conductor network being monitored. This is in particular an advantage, when many systems are provided. Said digital interface also provide the possibility of providing further information and remote control concerning actual conditions for current and voltage.

In yet an embodiment of the indicator system according to the present invention, it further comprises indicator resetting means, and in one embodiment thereof said indicator resetting means is provided with means enabling a remote resetting. Said indicator resetting means is for resetting the indicator system, when the conductor is back to normal state current after a short circuit, and may comprise manual resetting means, e.g. a switch or a push button on the detection unit, automatic resetting means, and/or digital interface.

In an embodiment of the indicator system according to the present invention, it further comprises power direction display means. Thus, a more accurate locating of the short circuit being indicated may be provided, which further reduces the maintenance time needed for repairing the line with the short circuit.

In another embodiment of the indicator system according to the present invention, it further comprises a substantially continuous power source for the detection unit, when in operation. As opposed to some known indicators, the determination and indication of a short circuit is not restricted by any detection time period of the current sensor. Instead, the detection, i.e. determination of current state and the relay of such information, is performed by said detection unit, based on said pulsed signal from the sensor. The fact that the detection unit itself is provided with a continual power source provides for a reliable indication of current state, even when the signal from the sensor is no longer available due to loss of sensor drive current from said conductor in the case of e.g. short circuits.

In another embodiment of the indicator system according to the present invention, said detection unit provides said current corresponding to the frequency of said current pulse signal as a current average or RMS translated from a continuously provided series of pulses provided within a measurement interval, preferably a short measurement interval in the range of around 1 ms. Accordingly, a very rapid indication of the conductor current is available for a determination of a short circuit and for display thereof, and optionally for display of said current average or RMS value, e.g. as a mean of a range of current averages or RMS values.

In another embodiment of the indicator system according to the present invention, said substantially instantaneous current value is provided to said detection unit for a determination of current and/or voltage quality. Due to the substantially instantaneous current value obtained by an indicator system according to the invention, an evaluation upon the quality of the current signal and/or voltage signal, i.e. the degree to which the conductor current and/or voltage approaches an ideally sinusoidal curve form, may be obtained, which degree is a measure of quality of the conductor current and/voltage.

An indicator system according to a further embodiment of the invention, said detection unit is provided integrally with said current sensor. Alternatively, depending on viewpoint, one or more current sensors may be provided integrally with said detection unit. This is in particular an advantage when monitoring LV lines, where high voltage solation is not required between the two.

In the following, the invention will be described in more detail with reference to two exemplary embodiments illustrated in the schematic drawings, where like numerals indicate same features, in which:

BRIEF DESCRIPTION OF THE DRAWINGS

FIG. 1.

DETAILED DESCRIPTION OF EMBODIMENTS

Figure 1:
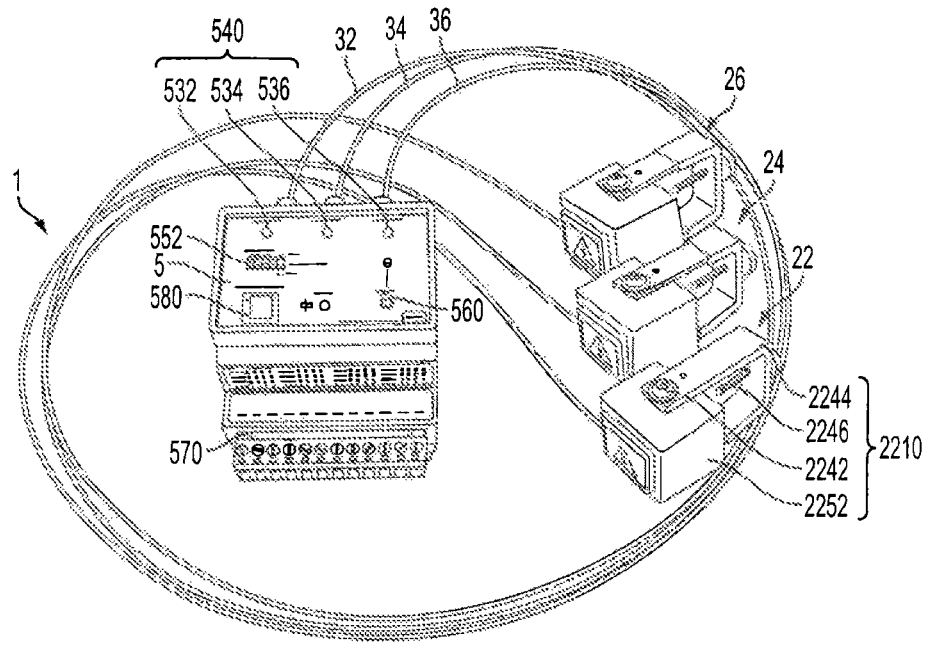
FIG. 1 is a photo illustrating an embodiment of an indicator system according to the present invention comprising three current sensors according to first embodiments thereof.

In FIG. 1 is shown a perspective view seen from above of an indicator system 1 according to an embodiment of the present invention, in which is adapted for indicating short circuits, comprising three current sensors 22, 24 and 26, respectively, according to first embodiments thereof according to the invention, each one being adapted for positioning upon each their conductor in a three phased AC power distribution network and for measuring the current therein for a current-to-frequency conversion into a pulse signal $CS_1$ in the form of a light wave signal, the pulse frequency $Pf_{CS}$ thereof being an indication of the current level measured.

The current sensor 22 continuously senses, i.e. measures and transmits information in said current level indication pulse signal $CS_1$ concerning the actual conductor current in successive predetermined measurement time periods or detection intervals, the duration of which is kept as low as possible to provide a rapid indication, such as 1 ms. This allows for a sufficient large number of pulses within said period to provide substantially instantaneous current magnitude values, further providing an improved statistical accuracy and enables a precise current average or RMS-value within said preset measurement time period, which is at least five times faster than the detection time periods reached by presently available known indicator systems. The pulse frequency $Pf_{CS}$ of said pulse signal may be e.g. 10 times or more per measurement time period, i.e. 10 kHz or more, see the discussion in relation to FIG. 5A-5C.

Correspondingly, in some embodiments of said current sensor 22 further signals or pulse signals may be provided by said current sensor for an indication of e.g. sensor availability during relatively low normal state current conditions, and/or voltage lost over the conductor or conductors after a predetermined time period, and/or information on phase angle and polarity of the voltage and/or current for determining power flow direction or direct information thereof in the conductor, to be cooperating with corresponding detection and display means, as will be described further below. Further, by using different signals for each different measurement several signal processing techniques known to the skilled person may be used to differentiate between the different signals and their information content. The different signal processing techniques are known to the skilled person and will not be discussed further, other than mentioning a few examples comprising using different amplitudes of the pulse, different widths of the individual pulses, different pulse frequencies, using discerning techniques for differentiating between superimposing pulses using signal processing means, and the like, such as using different light wave frequency bands, i.e. infrared, visible red, visible green, and/or laser light of different wave bands and amplitudes.

Said system 1 further comprises one communication link for each sensor, comprising fibre optic cables 32, 34, 36, the proximal end thereof being arranged with said one current sensor and the proximal end thereof gathered in one detection unit 5 for individual determination and indication of a short circuit being present. Alternatively, a common communication link, determination and indication may also be provided. Each of the three current sensors 22, 24, 26 is of similar construction, and thus only one will be described further below in relation to the description of FIG. 3. Three sensors have been illustrated; one intended for each phase in a three phase 1 kV rail road power line. However, obviously, any number of sensors and corresponding communication link or links may be provided depending on application, e.g. from one sensor, one detection unit for each conductor, to several sensors, one for each conductor being monitored, and one or more detection units within one or more detection units. Further, the example being shown for measuring 1 kV cables are only intended to be exemplary, and not limiting in scope.

The communication link is a fibre optic cable, which may be of any available grade, such as a 1 mm core jacketed plastic fibre cable SH4001, which is suitable for transmitting light wave pulses having certain given pulse frequencies, and using the same or different light frequency bands. The length of said fibre optic cable may be any suitable length, depending on wave attenuation therein, for example a cable being 1 to 10 meters in length.

As further shown in FIG. 1 the current sensor 22 may comprise a current transformer 2210 of the clamp-on type generally provided with a sensor housing 2252. Said current transformer 2210 comprises a U-shaped yoke 2244 of a magnetically inducible material, which is to be clamped around said power line using attaching means 2242 and is magnetically fixed by a screw 2246 to the housing 2252. The transformer 2210 is provided in such a way, e.g. using a coil around a core (not shown) extending between the detaching means 2242, that a driving electrical power is supplied to sensor circuitry (not shown), which will be described in detail below in relation to the discussion of FIGS. 3 and 4, within the housing 2252, at least when a short circuit current is flowing in the power line being sensed. Thus, a self-sufficient power supply for driving the sensor circuitry is provided. As a supplement a from the surroundings electrically insulated external or internal power supply may be provided, e.g. in the form of solar cells, when the area surrounding the current sensor is provided with sufficient light, e.g. sunlight, or batteries within the current sensor housing, which in particular is an advantage for monitoring low current power lines. A recent technique for providing a external power supply which is electrically insulated from the surroundings, is an RF-powered power receiver in which power is supplied over radio frequency waves provided remotely from said current sensor.

Further, said sensor may be provided with a electromagnetic waveband supplied sender/receiver (RF, light, IR etc) for relaying data concerning the measurements performed, and/or for setting and/or regulating other values within the sensor, such as e.g. the current interval $I_1$-$I_2$ being measured within, $I_{max}$ and/or the like.

In one embodiment (not shown) the current sensor may further be adapted for sensing more than one conductor. This may be the case when sensing earth leakages on conductors leading to electric loads, such as pumps, heaters, lightening and the like, where difference analysis may be performed upon such multitudes of conductors to be measured upon. For example, the current sensor may be adapted for this use if the size of the yoke of said inductive wire-wound current transformer is adapted for surrounding, holding and sensing more than one conductor. The transformer in the sensor may then be provided for sensing more than one cable, and e.g. provide a detection signal, when the current going one way is not equal to the current returning, i.e. the sum of currents is different from zero. Such a difference analysis is required, e.g. when performing earth leaks to said electric load. This is in particular also an advantage for multi-cabled conductors, e.g. when the conductor is provided with a two or more current leading conductors and/or one or more grounded cable sections.

Figure 2:
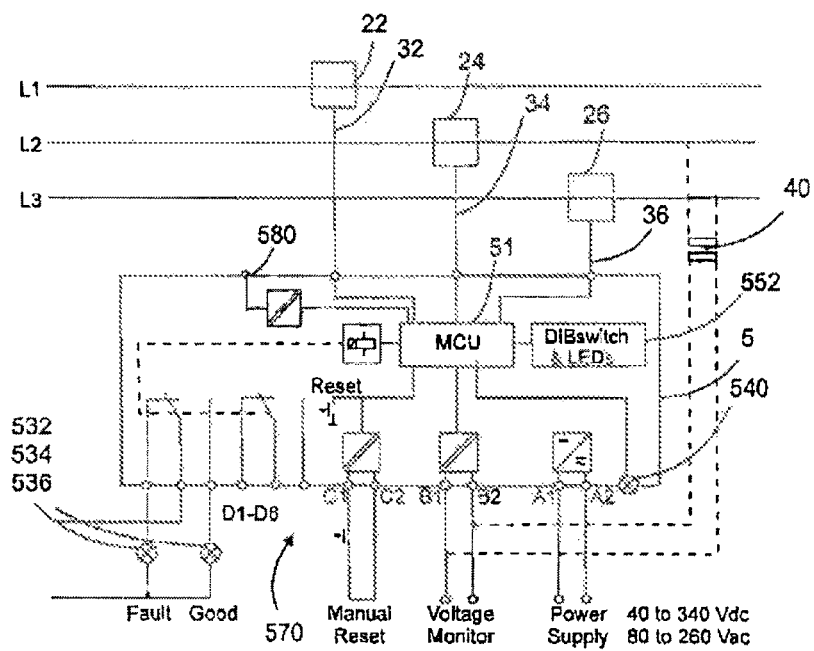
FIG. 2 is an overview of the indicator system of FIG. 1.
Figure 3:
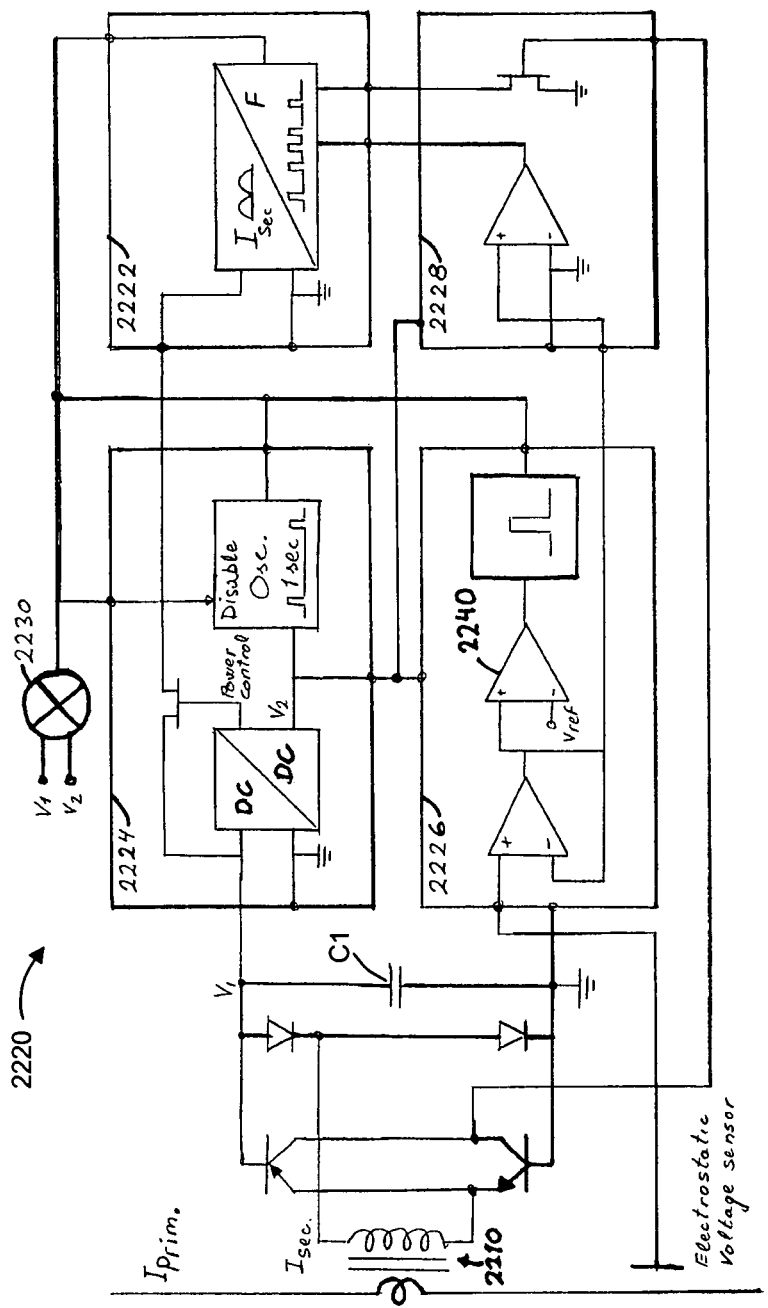
FIG. 3 is a very schematic overview diagram illustrating a second embodiment of a current sensor according to the present invention comprising current sensor circuitry.

The detection unit 5 comprises detection means 51, as shown in FIG. 2, which for example may be a light pulse detector such as a photodiode or the like, e.g. integrated with a micro controller unit, comprised within a housing having a front face for easy reading. Said detection unit 5 further accommodates detection circuitry (not shown for simplicity and easy overview). The detection unit 5 further comprises short circuit display means in the form of one red and one green LED for each short circuit display means 532, 543, 536 on the front face, the switching of them may show a red light, when a short circuit is determined on the conductor, and a green light, when a normal state current is measured, and/or when a sensor availability indication signal is registered by the detection means 51, in which case the LED's may also function as sensor availability display means 540. In FIG. 3 there is shown a separate LED 540 provided upon the indicator housing.

Further, said detection unit 5 may comprise current level display means (not shown), which may display the average value or the RMS-value of the currents being measured on the three conductors providing the operational current value, or may be the input current value to which the indicator system is provided. The display means may be provided a LCD display, or a level indicator display, or other suitable means for communicating a relative number value. This input current value or short circuit set points value can either be adjusted manually by DIP switches 552, by up/down switches and/or be set remotely, wherein other variants in itself is known to the skilled person. Further, said detection unit 5 comprises indicator resetting means 560 for a resetting of the indicator system after a short circuit has been indicated, e.g. when the line repaired accordingly. The short circuit display means or LED's 532, 543, 536 may stay red until the indicator has been reset. The resetting means may also comprise an external manual reset, or an automatic reset after an adjustable given time period, e.g. 4 hours or one day, given the maintenance personnel sufficient time to register the short circuit and repair it. The setting of said operational or input current value, the resetting of the indicator system 1 and display by the short circuit display means may further be performed remotely from said detection unit 5 e.g. using a digital interface 580 thus relaying remote instructions and displays. Further, said detection unit 5 is provided with a mounting system 570, e.g. for cooperation with a standard rail, such as DIN rail TS 35.

In FIG. 2 is shown a schematic overview of the indicator system 1 of FIG. 1, wherein the sensor units 22, 24 and 26 are placed around conductors L1, L2 and L3, such as a three phased 1 kV rail road electric power line. Respective fibre optic cables 32, 34, and 36 are provided to relay non-electrical wave light signals from said sensor units 22, 24, and 26, respectively, to the detection unit 5, where a micro controller unit or MCU is provided for processing the individual light signals from each sensor unit. The light signals received comprise current pulse signals, the frequency of which is proportional to the conductor current measured. The micro controller unit MCU is able to translate each received signal or pulse signal CS into a current value and functions as the detection unit 5.

The conductors L1, L2, L3 are 1 kV AC rail road power lines, e.g for supplying light and service power to locations along the railroad. However, said current sensors 22, 24, 26 may be adapted to any electric AC conductor of a small to large diameter, e.g. from between a few mm to several cm. However, size considerations are to be taken, as in particular the yoke 2244 must be adapted for fitting conductors of different sizes. The conductors may be AC conductors for LV, MV, and HV power lines, depending on the composition of the sensor circuitry.

Said detection circuitry comprises detection means 51 for sensing at least the frequency of at least said current pulse signal and translating it to a current corresponding to the frequency of said current pulse signal, e.g. by the use of said MCU as shown in FIG. 2. In the short circuit indicator system, the detection circuitry further comprises current threshold means operable for determining whether the current corresponding to the frequency of said current pulse signal CS is above a predetermined current threshold $I_{max}$. The system further comprises voltage threshold means operable for determining whether the voltage measured by voltage measurement means is below a predetermined voltage threshold $V_{min}$ after a predetermined time period $t_1$, such as around 200 ms for a 1 kV power line or at least below 500 ms, after said current threshold means has made a positive determination of a current above the predetermined current interval. Such detection circuitry may however be provided according to conventional techniques for the skilled person, and will not be described further herein. The predetermined time period is selected according to application, i.e. power levels monitored. Means 51 may be provided integrally, i.e. the MCU and the determination means, e.g. in a bi-stable relay for changing the short circuit display means to a fault state, e.g. a LED emitting red visible light.

The input current value set by the DIP-switches 552 on the detection unit 5, which input current determines an over current trigger level or current threshold of the detection unit 5, which is depending on type of conductor being measured upon. For example due to the sine wave current measured in AC power lines, an input current value setting of say 40 A will correspond to a over current setting of 40·√2 or 54.4 A. The actual allowed current $I_{max}$ in the measurement time period of 1 ms will for the 40 A input current setting thus be 54.4 A. In other words, any current measured, that is higher than 54.4 A in a 1 ms period, followed by a voltage measurement after said 200 ms delay, e.g. $V_{min}$ below either 20 Vdc or 40 Vac, will be detected as a short circuit current of the 40 A range of ±10% or ±5%, or better yet according to application.

Said voltage measurement means may be provided in two ways: In a first embodiment said voltage measurement means is a separate voltage measurement monitor 40, as shown in FIG. 2, which may be the provided by the main transformer used at the site, providing a measurement to be relayed to the MCU for a determination as to whether the voltage is lost, i.e. below said voltage threshold $V_{min}$, e.g. from 10 to 50% of nominal voltage or less, after said predetermined time period $t_1$.

In a second embodiment, the voltage measurement means and voltage threshold means are provided integrally 2240 within the current sensor 22 in a voltage lost indication circuitry 2226, as indicated in FIG. 3, for providing an electrostatic voltage measurement of said electric conductor, which may be implemented using various available components, being adapted to provide said non-electrical wave signal as a voltage lost indication signal VLS, the presence of which is indicating that the voltage over said electric conductor is lower than said predetermined minimum voltage value after said predetermined time period. The second embodiment provides the advantage of reducing the installation time by decreasing the number of components to be installed separately and simplifying the detection circuitry.

Performing a voltage measurement after a given time period ensures that temporary current peaks within the conductor, which peaks are not due to short circuits, may not erroneously be determined as being short circuit currents. Said voltage measurement performed with the sensor is optional, but a voltage measurement is required for correctly determining whether a power surge is in fact a short circuit and not some other short lived power glitch.

A manual reset is provided as a switch over the terminals C1 and C2 for resetting the indicator system to an operational state, e.g. when the short circuit has been repaired or when the current state has returned to a normal mode.

The power supply for the detection circuitry is provided by a substantially stable power supply, e.g. an electrical AC or DC power source, such as mains, a battery pack or the like provided at the terminals A1 and A2. Thus, no restrictions are put upon the short circuit current detection time period, and a reliable determination of a short circuit is provided.

During use, as shown in FIG. 2, when each current sensor 22, 24, 26 is clamped on to their respective conductor L1, L2, L3 a non-electrical wave pulse signal is generated by each current sensor 22, 24, 26, where the pulse frequency of the resulting pulse signal is proportional to the AC conductor current sensed by the respective current sensor on the conductor. A short circuit display in the form of LED's 532, 534, 536 are provided for each current sensor provided for an indication of a short circuit or fault state of the conductor being sensed. Alternatively, one common LED is provided for all sensors, indicating a short circuit or in other examples of the indicator system other current based states as well, such as power, reactive power, and the like.

As shown in FIG. 3, the sensor circuitry 2220 is supplied with a driving current, i.e. a self-sufficient supply, over current transformer 2210, and comprises current level indication circuitry 2222, comprising a current-to-frequency converter using one or more amplifiers for the provision of a light wave pulse signal having a frequency $Pf_{CS}$ proportional to the input current, i.e. magnitude of conductor current, which pulse signal is emitted by means 2230, i.e. a LED, which is common to all light wave signals being emitted from the current sensor. Alternatively, a first group of emitters may send out one, a number or all of the signals, a second group again one, some or all; or one LED is provided for each signal to be emitted, which requires corresponding communication links and receiver means within the detection unit 5.

Said predetermined current interval $I_1$-$I_2$ is the working range of the current sensor, i.e. the conductor current suitable for delivering the driving current of the sensor circuitry for providing a pulsed light signal. This range may preferably be selected according to application, e.g. 10 to 200 A for 1 kV lines, or 5 to 500 for LV power lines by appropriately selecting the components of the circuitry. In order to be detectable, the pulse width is set to a suitable width in relation to the measurement interval of 1 ms, and present day detection units are available for detecting pulse widths in the range of less than 10 μs, e.g. between 0.5 to 5 μs, preferably from 1 to 3 μs, most preferably approximately 1.2 to 2 μs. The height and/or width of the individual pulses may be suitably selected for differentiation purposes. This selection of resolution of the pulse train is an advantage of the present current sensor, because it may easily be adapted to any given detection resolution of a corresponding detection unit in a system according to the invention.

The above mentioned Imax, i.e. the current threshold value for identifying e.g. short circuits or line failures, preferably is selected as lying within said current detection interval $I_1$-$I_2$ or may be defined as being equal to $I_2$.

Figure 4:
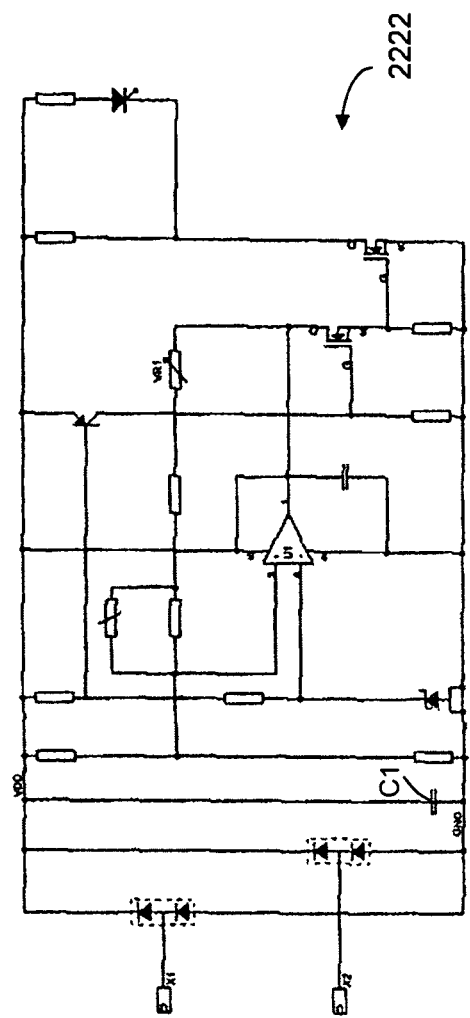
FIG. 4 is a simplified circuit diagram of sensor circuitry for a current sensor of FIG. 3.

An example of current level indication circuitry 2222 is shown in FIG. 4, in which an electric power input is provided at the two terminals, e.g. from the current transformer 2210, of a current-to-frequency converter and the output is provided by a pulse signal from a LED, the pulse frequency of which is proportional to the current over said transformer 2210. The circuitry 2222 comprising a current-to-frequency converter comprises an operational amplifier/comparator, which is connected in an arrangement with a number of circuitry components. Given the fact that the person skilled in the art is aware of different techniques of how to adapt the circuitry component types, values and positions in accordance with the application required, and to provide current-to-frequency converters of other types these will not be discussed further here.

According to the invention, the specification to which each sensors current-to-frequency converter must adhere to depends on the application. The circuitry 2222 shown in FIG. 4 is arranged as to be applicable for a three phased 1 kV rail road service power line, one sensor for each phase, and adheres to the following specifications: Operational current input interval from 40 A to 160 A, allowing for a proportionality, i.e. a single-variable dependency, which may be non-linear, or partly or wholly linear or logarithmically proportional within a suitable output frequency interval i.e. for cooperation with the detection unit of the short circuit indicator system, such that it is able to reliably register the pulse frequency thereof, which suitable frequency interval may be from 50 kHz to 180 kHz for a high resolution and reliable detection with presently available detector components.

As shown in FIG. 3, the sensor circuitry 2220 further comprises sensor availability indication circuitry 2224 for providing a sensor availability indication signal AS, the pulse frequency $Pf_{AS}$ of which is being predetermined and relatively low compared to the pulse frequency $Pf_{cs}$ of said current level indication pulse signal $CS_1$, e.g. an interval between once per one tenth of a second and once per ten seconds, preferably around once per second.

The sensor circuitry further comprises voltage lost indication circuitry 2226, which preferably may be integrated with said sensor availability indication circuitry 2224, for providing an electrostatic voltage measurement of said electric conductor and adapted to provide said non-electrical wave signal as a voltage lost indication signal or pulse signal VLS, the presence of which is indicating that the voltage over said electric conductor is lower than a predetermined minimum voltage value after a predetermined time period, which is preferably shorter then the period of the sensor availability indication signal, such as after 200 ms. It may be a specific singular pulse signal, different from each of the other signals from the current sensor in order for the detection unit to be able to differentiate between them.

As shown in FIG. 3, the sensor circuitry 2220 further comprises power flow direction indication circuitry 2228. Two different embodiments are contemplated, a first 2228A for providing information concerning voltage measurements for a subsequent power flow direction determination in the detection unit 5, e.g. providing two distinct pulse signals having each their pulse frequency $Pf_{PA}$ and $Pf_{PP}$, one corresponding to the phase angle and one the polarity of said measured voltage, said pulse signals being emitted from said means for emitting a non-electrical wave signal; and a second embodiment, wherein the flow direction determination is performed within the sensor circuitry, providing a singular pulse signal having binary values based on a continuous determination of the current flow direction. Other ways of indicating power flow direction is known to the skilled person, relayed to the detection unit 5. Correspondingly, the detection unit 5 is able to differentiate and translate these pulse signals into a power flow direction value, which is binary, e.g. either the current flows in one direction during the short circuit or it flows in the other, where the current flow direction is being indicated with flow direction display means (not shown). Thus, the direction to the short circuit may be indicated for the maintenance personnel for easy and quick repair.

The circuitry 2222, 2224, 2226, 2228 may be provided integrally, in particular the circuitry 2224 and voltage lost indication circuitry 2226 may be provided integrally, the voltage lost circuitry taking advantage of an amplified voltage being present for the sensor availability indication circuitry 2224 for a reliable voltage lost indication. Further, energy preservation circuitry may be included for administering and reducing power consumption of the sensor circuitry. It has by the invention been realized that further circuitry for providing additional measurements of properties of the electric conductor may be included for processing, determination and/or indication by said detection means 51 and unit 5, and the current sensor according to the invention may be used for other applications than in an indicator system for short circuits as described herein.

Further, said sensor may be provided in one unitary unit, see FIGS. 1 and 2, in which case a low power consuming unit is provided, which is suitable to cooperating within an indicator system as described.

Obviously, given the fact that the indicator may be provided with the ability to receive nearly instantaneous live current values and optionally voltage levels, the indicator may further be adapted to indicate actual power values and/or levels, i.e. averages thereof, and/or to indicate reactive power in the AC conductor being measured when the phase angle of the current/voltage is also provided.

Further, said indicator system may be provided integrally (not shown), which may be an advantage in particular in LV systems, where a high voltage electric isolation is not required, in which case the entire indicator system comprising one or more sensors may be installed in one installation step.

In use, a method of rapid indication of a AC current state in an electric conductor comprises the steps of providing a current measurement by a current sensor according to the invention provided at said electric conductor; transforming said current measurement into a current pulse signal, the frequency of which is proportional to said current measurement; relaying said current pulse signal to a detection unit for a translation into an instantaneous current value for application to determining different conductor states, such as instantaneous current value, the occurrence of short circuits, relay cut outs, power surges, and the like.

One current state is determining if a short circuit has taken place, said method further comprising determining if said current pulse signal is above a predetermined current threshold, and in that case after a predetermined time period determining by a voltage measurement on the electric conductor, if the voltage is below a predetermined minimum value, and in that case indicating that a short circuit has occurred on said conductor.

Test Results

Extensive testing was performed with the current sensor of FIG. 1 having a sensor circuit diagram equivalent to the one shown in FIG. 4.

FIGS. 5A to 5E show the signal from said current sensor showing actual conductor current and the corresponding frequency signal from the transmitting LED of the current sensor.

Figure 5A:
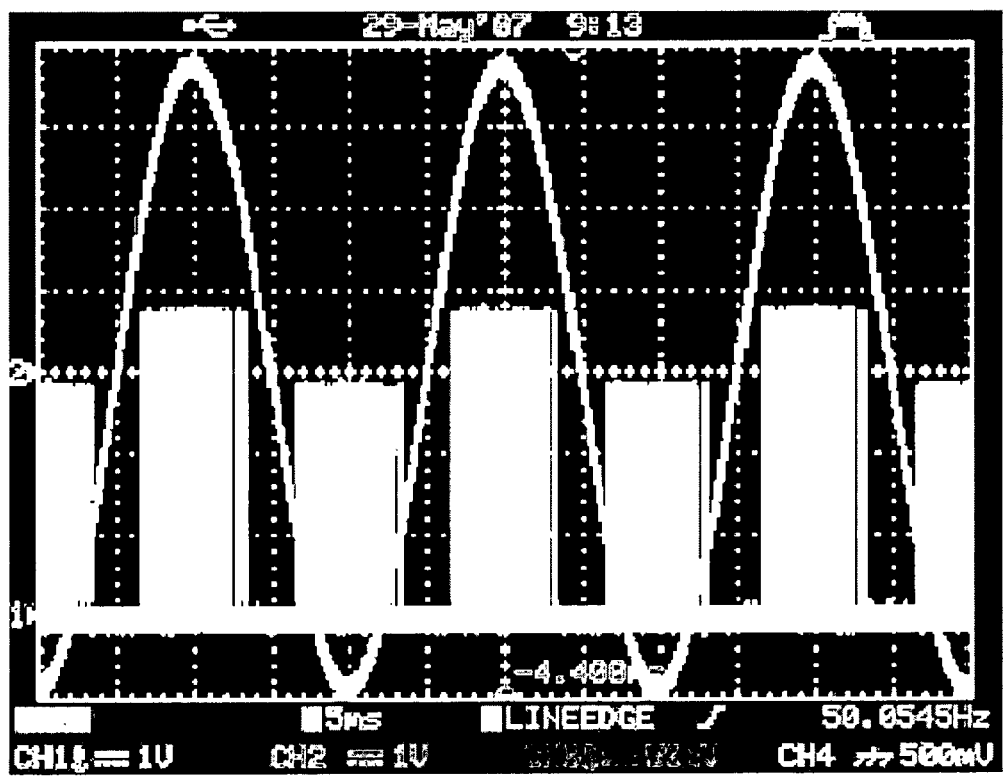
FIG. 5A-5E are output displays from a test setup comprising a current sensor according to a first embodiment of the invention, displaying the actual conductor AC current and the resulting light pulse frequency from the current sensor.

In FIG. 5A, is shown the measured conductor current, i.e. a sinus curve around 50 Hz, having zero at the horizontal line indicated by 2>, and the corresponding frequency output of the LED, indicated by the light output, having its zero at the horizontal line indicated by 1>, each division of the x-axis corresponding to 5 ms. As may be seen more clearly from FIG. 5B, which is a zoom of FIG. 1, a more detailed view of the input and output of the current sensor is shown, where each division of the x-axis is 2.5 ms, where the seemingly step-like light output is in fact constituted by a light pulse train having frequencies far higher than said AC current being measured.

Figure 5B:
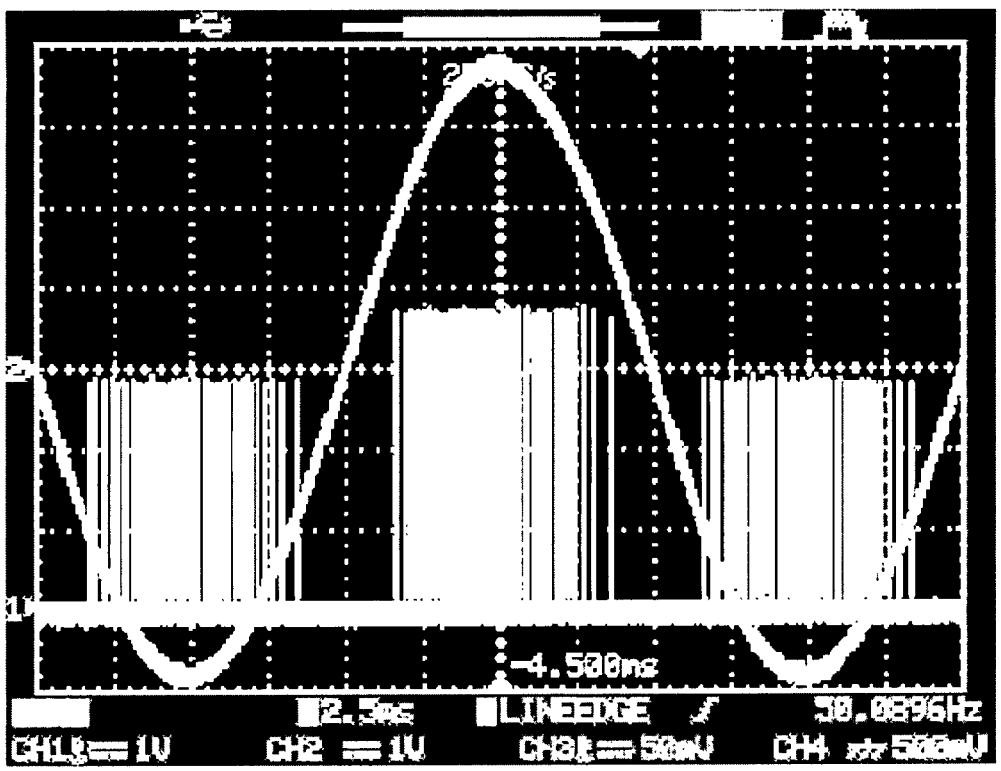

It may also be observed from FIGS. 5A and 5B, that the information regarding the polarity of the actual current signal is shown as two different intensity levels of the light emitted from the LED. Negative currents are in fact discernible from positive currents by the maximum height of each light frequency pulse, the former being generally lower than the latter. This enables a detection of the polarity of the instant current measured, which may also be indicated by said detection unit 5.

Figure 5C:
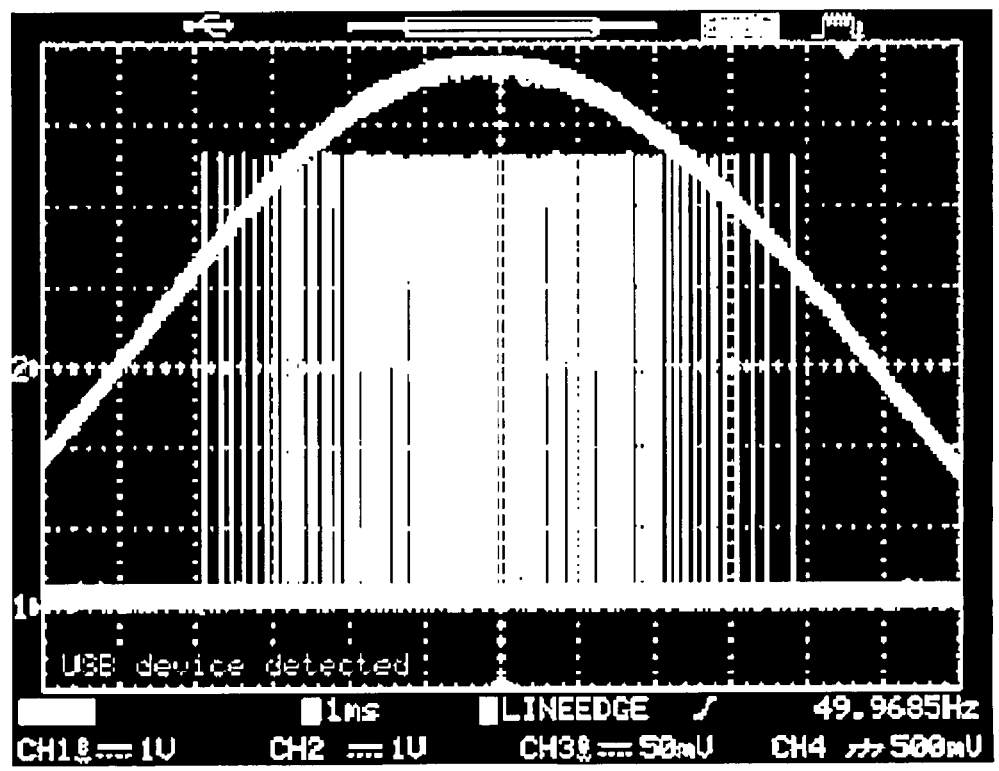

In FIG. 5C, an even more detailed view of the current sensor input and output is shown in a zoom, where each division of the x-axis corresponds to 1 ms. Here, it is clearly seen, that an instant current magnitude value may be provided by the frequency, i.e. the number of light pulses per time period, i.e. 1 ms in FIG. 5C.

Figure 5D:
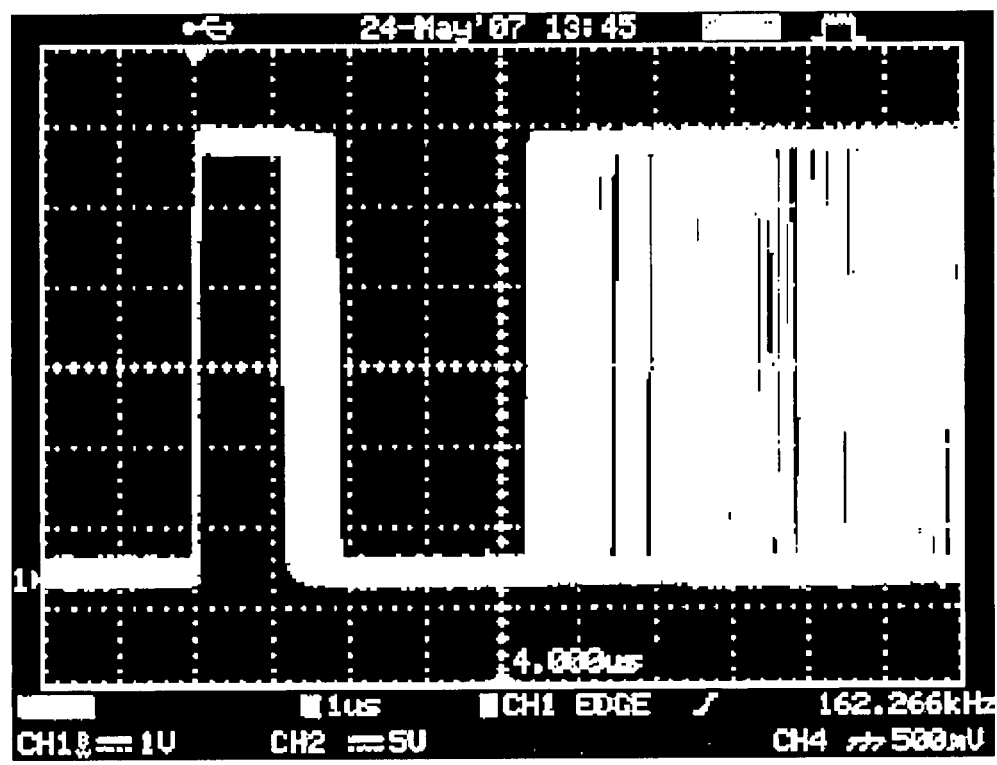
Figure 5E:
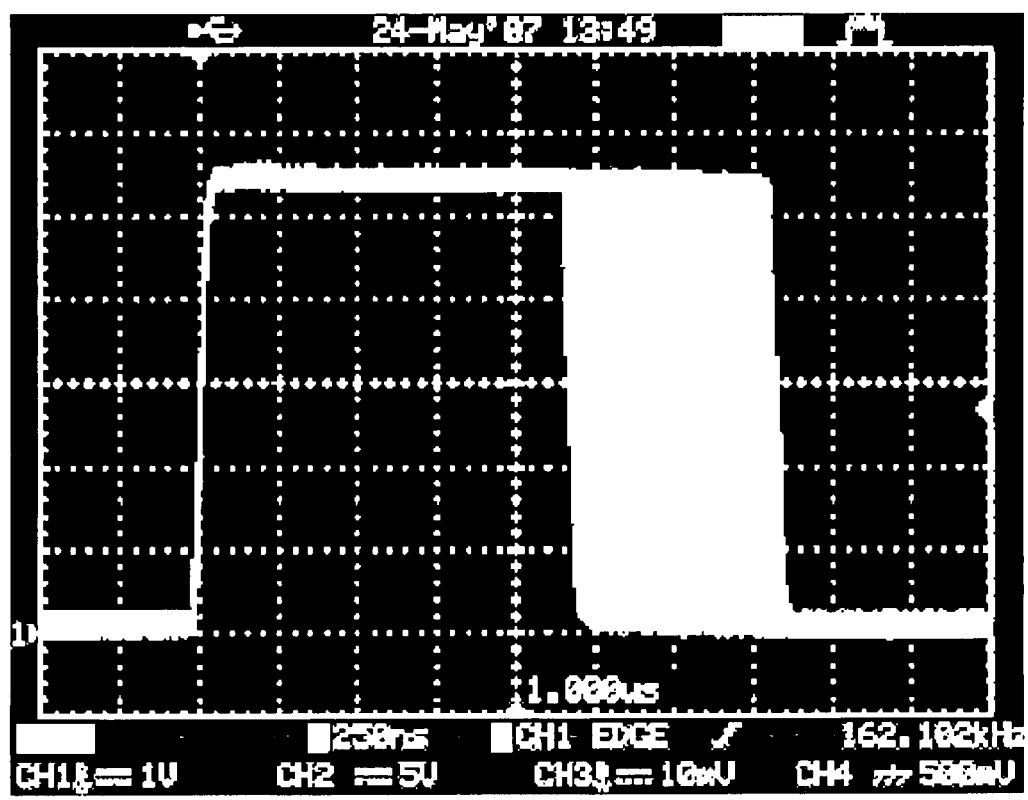

In FIGS. 5D and 5E, the rising front of a superposition of a series of individual pulses from FIGS. 5A, 5B and 5c are shown, wherein the front of each signal is positioned upon each other. The zoom here being at each division in 1 μs, and 250 ns, respectively on the x-axis. The trailing edge of the first pulse is an indication of that the width of each pulse (left "pulse" in the image) may differ in such a way that the higher the value of a instantaneous conductor current being measured, the wider the width of the light pulse being emitted and vice versa. This is due to the lapse of the discharge time of the capacitors being used in the sensor circuitry. Further it is shown, that the succeeding pulses (right "pulse") also may be provided with different distances to their leading pulse, which fact is also caused by said effect. Accordingly, further information concerning the current values may be extracted by the distances between two pulses and/or the width of each individual pulse. Accordingly, current measurements of as low as two and even one pulse per measuring period (1 ms) is provided, which is a very substantial improvement relative to known indicator systems.

It is clear, that the dynamic range of current sensor, i.e. the operational measured current interval to output frequency interval, may be adapted to be suitable for the given application. Further tests have shown, that a dynamic range in the order of 1 to 500 A, including the range wherein the sensor availability function is active, is attainable for the current sensor according to the invention, which range obviously may be shifted up or down according to current interval being measured by suitable selection of the circuitry components in the sensor circuit. The tests reveal that the attainable relationship between minimum and maximum current value generally is 1:100.

Generally, when selecting a wide dynamic current detection range e.g. from 1:10 up to 1:200 depending on the transformer and components in use, this results in an increased cost and vice versa. Accordingly, in fact any appropriate dynamic current range may be selected, e.g. when providing a current sensor according to the invention for HV power lines, a wide dynamic range may be selected, for MV power lines a narrow dynamic range, and for LV power lines a short dynamic range or vice versa. This will also be directly reflected in physical size of the current sensor, which again is a function of transformer size.

An indicator system according to the invention may further comprise a temperature sensor (not shown), e.g. said detection unit 5 comprising said temperature sensor in order to provide indications of this parameter in order to detect further error states, such as flashover or fires close to the indicator system.

An indicator system according to the invention, wherein said detection unit further is comprising display means and/or relaying means for remote indication of a measured voltage and/or a phase angle and/or power and/or Another application of the sensor and indicator system according to the invention has been realized. The provision of nearly instantaneous current values even provide a unique opportunity of evaluating the quality of the conductor current and/or voltage quality, when a supplemental voltage measurement is provided. The quality of a conductor current or voltage may be defined as the degree as to which the resulting signal curve corresponds to the ideal sinusoidal curve. The higher this degree the better because a non-sinusoidal curve indicates power losses or other problems on the conductor line. In one embodiment the detection unit is provided with the ability of providing an evaluation of a series of instantaneous current and/or voltage values and a correlation to the expected sinusoidal form, the indicator system is able to provide detection of such current states upon said one or more conductors being monitored.

The invention claimed is:

1. An AC current sensor (22; 24; 26) for performing a substantially real time measurement of electric AC current magnitude in a conductor and for generating a non-electrical wave signal as an output, said non-electrical wave signal comprising a series of pulses having a frequency, which is proportional to the magnitude of current measured, said current sensor comprising:

a current responsive unit comprising an inductive wire-wound current transformer (2210), adapted for mounting adjacent to said electric conductor, said inductive wire-wound current transformer (2210) providing electrical power as a driving current for said current sensor;

a sensor circuitry (2220) comprising current level indication circuitry (2222) comprising a current-to-frequency converter adapted to provide said non-electrical wave signal as a substantially real time current level indication pulse signal ($CS_1$) having a pulse width of 0.5 to 5 μs and a pulse frequency ($Pf_{cs}$) that is proportional to the magnitude of said conductor current when it is within a predetermined current interval ($I_1$-$I_2$); and said sensor circuitry (2220) further comprising a means (2230) for emitting said non-electrical wave signal as an output to a remote detector, said means (2230) further being adapted for providing at least one further non-electrical wave indication signal in form of a current polarity indication signal (POS) to the remote detector, wherein said non-electrical wave signal and at least one further non-electrical wave indication signal are provided simultaneously.

2. A sensor according to claim 1, wherein the pulse frequency ($Pf_{cs}$) of said current level indication pulse signal ($CS_1$) lies within a predetermined frequency interval, where said frequency interval is selected to be suitable for cooperation within an indicator system for indicating current states in said conductor, such as a short circuit condition.

3. A sensor according to claim 1, wherein said sensor circuitry further comprises:

a sensor availability indication circuitry (2224) adapted to provide said non-electrical wave signal as a sensor availability indication signal (AS) indicating the availability of the sensor, in particular when the electric conductor current is below said predetermined current interval ($I_1$-$I_2$);

a voltage lost indication circuitry (2226) for providing an electrostatic voltage measurement of said electric conductor and adapted to provide said non-electrical wave signal as a voltage lost indication signal (VLS), the presence of which is indicating that the voltage over said electric conductor is lower than a predetermined minimum voltage value after a predetermined time period after the current is below said predetermined current interval, which predetermined time period is preferably shorter than the period of the sensor availability indication signal, such as after from 50 to 500 ms;

a power flow direction indication circuitry (2228A) for providing a phase angle indication signal (PAS) and a polarity indication signal (POS) from said means for emitting a non-electrical wave signal; and a power flow direction indication circuitry (2228B) for providing a specific flow direction signal (BS) indicative of said power flow direction from said means for emitting a non-electrical wave signal;

wherein, said sensor availability indication circuitry and said voltage lost indication circuitry is provided integrally for providing at least said voltage lost indication signal (VLS) in the form of at least one specific pulse signal.

4. A sensor according to claim 3, wherein a pulse frequency ($Pf_{as}$) of said sensor availability indication signal (AS) is predetermined and relatively low compared to the pulse frequency ($Pf_{cs}$) of said current level indication pulse signal ($CS_1$), such as the interval between once per one tenth of a second and once per ten seconds, preferably around once per second.

5. A sensor according to claim 1, wherein said means for emitting a non-electrical wave signal is selected from one or more devices for providing at least one of all signals and/or pulse signals, such as at least one light emitted diode producing a light wave signal as the non-electrical wave signal.

6. A sensor according to claim 1, wherein said means for emitting a non-electrical wave signal is one device for each signal, wherein at least one of the wave frequency band, amplitude, the pulse width, and height of each signal differs from the others.

7. A sensor according to claim 1 being adapted for:
an electric conductor being an AC power line in applications such as in a power distribution network and for a rail road; and
sensing more than one conductor.

8. An indicator system (1) for an electric conductor, comprising an AC current sensor (22; 24; 26) according to claim 1.

9. An indicator system according to claim 8, further comprising:
an electrically isolated communication link (32; 34; 36) for relaying at least said non-electrical wave signal from said current sensor; and
a detection unit (5) operable for sensing at least the frequency of at least said current level indication pulse signal ($CS_1$) from said current sensor and translating it to an substantially instantaneous current value for application to determining different conductor states, such as instantaneous current value, the occurrence of short circuits, relay cut outs, power surges.

10. An indicator system according to claim 8, further comprising:
a voltage measurement unit (40; 2240) for performing a voltage measurement over said electric conductor;
a voltage threshold unit operable for determining whether the voltage measured by said voltage measurement means (40; 2240) is below a predetermined voltage threshold ($V_{min}$) after a predetermined time period (t1) after a current threshold unit has made a positive determination, wherein said voltage measurement unit and said voltage threshold unit are provided integrally within said current sensor having a voltage lost circuitry;
the current threshold unit, comprising an adjustable input current setting device (552), operable for determining whether the current corresponding to the frequency of said current pulse signal (CS) is above a predetermined current threshold (Imax);
a short circuit indication unit (532; 534; 536), comprising at least one light emitting diode (523; 534; 536), operable for indicating that a short circuit has occurred on said electric conductor based on said current determination or when said voltage threshold unit has made a positive determination;
a substantially continuous power source for the detection unit (5), when in operation;
an indicator resetting means (560) comprising a means (570) enabling a remote resetting;
a temperature sensor;
a sensor availability display means (540), which is operable in particular when said conductor current is below said predetermined current interval ($I_1$, $I_2$); and
a current level display means and a power direction display means.

11. An indicator system according to claim 9, wherein said detection unit (5) is:
remotely located from said current sensor (22; 24; 26); or
provided integrally with said current sensor (22, 24, 26).

12. An indicator system according to claim 9, wherein said detection unit (5) provides said current corresponding to the frequency of said current pulse signal as a current average or RMS-value translated from a continuously provided series of pulses for reflecting the real time current.

13. An indicator system according to claim 10, wherein said detection unit (5) comprises:
said temperature sensor, and
a display means and or relaying means for remote indication of a measured current, voltage, phase angle, power, voltage or current quality, polarity, or other determined value based on any of the mentioned parameters.

14. An indicator system according to claim 10, wherein said short circuit indication unit is further provided remotely from said detection unit (5) for a remote indication of one or more current states, such as a short circuit.

15. An indicator system according to claim 10, wherein said adjustable current threshold setting device is provided with means (580) for a remote setting of the adjustable current threshold.

16. The sensor according to claim 1, wherein said sensor circuitry (2220) further being adapted for providing at least one further non-electrical wave indication signal in form of at least one of a sensor availability indication signal (AS), a voltage lost signal (VLS), a current phase angle indication signal (PAS), and power flow direction signal (BS).

* * * * *